United States Patent
Nakagawa et al.

(10) Patent No.: US 6,452,091 B1
(45) Date of Patent: Sep. 17, 2002

(54) METHOD OF PRODUCING THIN-FILM SINGLE-CRYSTAL DEVICE, SOLAR CELL MODULE AND METHOD OF PRODUCING THE SAME

(75) Inventors: Katsumi Nakagawa; Takao Yonehara, both of Atsugi; Yasuyoshi Takai, Nara; Kiyofumi Sakaguchi, Yokohama; Noritaka Ukiyo, Atsugi; Masaaki Iwane, Hiratsuka; Yukiko Iwasaki, Atsugi, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/614,548

(22) Filed: Jul. 12, 2000

(30) Foreign Application Priority Data

Jul. 14, 1999 (JP) .............................. 11-200531
Jul. 30, 1999 (JP) .............................. 11-217188

(51) Int. Cl.[7] .......................... H01L 21/02; H01L 21/20; H01L 21/04
(52) U.S. Cl. .................. 136/261; 136/252; 136/265; 136/244; 136/245; 136/251; 438/455; 438/66; 438/67; 438/57; 438/458; 438/497; 438/477; 156/196; 156/212; 156/220; 156/224; 156/226
(58) Field of Search ................. 136/252, 261, 136/265, 244, 245, 251; 438/455, 66, 67, 57, 458, 497, 477; 156/196, 212, 220, 224, 226

(56) References Cited

U.S. PATENT DOCUMENTS

| | | | |
|---|---|---|---|
| 5,856,229 A | 1/1999 | Sakaguchi et al. | 438/406 |
| 5,875,769 A * | 3/1999 | Toyama et al. | 125/16.01 |
| 6,155,006 A | 12/2000 | Mimura et al. | 52/173.3 |
| 6,190,937 B1 * | 2/2001 | Nakagawa et al. | 438/67 |
| 6,194,239 B1 * | 2/2001 | Tayanaka et al. | 438/28 |
| 6,215,060 B1 * | 3/2001 | Komori et al. | 136/251 |
| 6,258,666 B1 * | 7/2001 | Mizutani et al. | 438/258 |

FOREIGN PATENT DOCUMENTS

| | | | |
|---|---|---|---|
| EP | 849788 A2 * | 6/1998 | |
| EP | 938129 A1 * | 8/1999 | |
| EP | 1059663 A2 * | 12/2000 | |
| JP | 6-5769 | 1/1994 | |
| JP | 6-140656 | 5/1994 | |
| JP | 7-302829 | 11/1995 | |
| JP | 7-302889 | 11/1995 | |
| JP | 7-302924 | 11/1995 | |
| JP | 8-222752 | 8/1996 | |
| JP | 8-222753 | 8/1996 | |
| JP | 9-177274 | 7/1997 | |
| JP | 9-331077 | 12/1997 | |
| JP | 2000-252510 A * | 9/2000 | |

* cited by examiner

*Primary Examiner*—Alan Diamond
(74) *Attorney, Agent, or Firm*—Fitzpatrick, Cella, Harper & Scinto

(57) ABSTRACT

The peeling of a thin-film single-crystal from a substrate is carried out so that the directions of straight lines on the single-crystal surface made by planes on which the single-crystal is apt to cleave are different from the front line direction of the peeled single-crystal. This single-crystal is used in a solar cell and a drive circuit member of an image display element. A method is provided which prevents a decrease in quality and yield of a single crystal layer when it is peeled from a substrate. A flexible solar cell module having a thin film single-crystal layer is made so that its flexing direction is different from the single-crystal's cleaving direction. Thus, a thin-film single-crystal solar cell module having excellent durability and reliability due to a lack of defect or cracking during production and use, and a method for producing the same, is provided.

30 Claims, 9 Drawing Sheets

METHOD OF PRODUCING THIN-FILM SINGLE-CRYSTAL DEVICE, SOLAR CELL MODULE AND METHOD OF PRODUCING THE SAME

BACKGROUND OF THE INVENTION

1. Field of the Invention

The present invention relates to a method of producing thin-film single-crystal devices, solar cell modules, and a method of producing the same. The thin-film single-crystal devices include, for example, photoelectric converters such as solar cells and devices for a circuit for driving image display elements such as liquid crystal display elements.

2. Related Background Art

A solar cell is becoming in common use as an independent source for driving various types of electrical machinery and apparatus or as a source for system interconnection with commercial electric power. As semiconductors constituting a solar cell, silicon and gallium arsenide are generally used. In order to obtain a high photoelectric conversion efficiency (efficiency to convert optical energy into electric power), these semiconductor single-crystals are preferably used.

In large-area image display elements such as liquid crystal display elements, with an increasing demand for a more high-fine and high-speed image display in recent years, a drive circuit formed within an element is required to have much higher capability. In order to meet this demand, the drive circuit should be formed on single-crystal silicon rather than amorphous or polycrystal silicon.

When using single-crystal semiconductors for the above purpose, there arise several problems. For example, in cases where silicon is used in a solar cell, the thickness of the single-crystal wafers commonly used is as thick as about 300 to 600 $\mu$m, while the film thickness required for the absorption of the incident sunlight is about 30 to 50 $\mu$m. Under recent circumstances where the single-crystal silicon used in solar cells accounts for ten percent of the total production, its consumption should be reduced. In image display devices, because of the form in which they are used, the light must be transmitted through the areas among the elements in a drive circuit. However, the single-crystal wafers in a common use are difficult to have such a structure formed thereon. In addition, the thickness of a single-crystal layer required for the drive element itself is only 1 $\mu$m or less, the rest portion merely serves as a supporting substrate.

In order to solve this problem, thin-film single-crystals having a suitable thickness should be selected depending on the purpose for which it is used; however, as long as the prior arts are employed, a single-crystal layer having a thickness of 300 $\mu$m or less is difficult to produce. Specifically, in some methods of prior art, since single-crystal substrates are produced in such a manner as to slice and polish an ingot single-crystal obtained by subjecting a melt of crystal material to crystal growth, single-crystal of 300 $\mu$m or less in thickness are difficult to obtain. In some other methods, in order to obtain a high-quality thin-film single-crystal for special purposes, etching is conducted on the back side of a single-crystal substrate having a thickness of several hundreds $\mu$m; however, a high-quality thin-film single-crystal is considerably difficult to produce by these methods. Recently, however, the method disclosed in Japanese Patent Application Laid-Open No. 7-302829 enables the peeling of a thin-film single-crystal from a substrate on which the thin-film single-crystal is epitaxially grown, and a technique disclosed in Japanese Patent Application Laid-Open No. 9-331077 enables the peeling of a portion ranging from the surface of a single-crystal substrate to a certain depth, as a thin-film, from the substrate. These methods, however, also have a problem that lattice defects may appear in a thin-film single-crystal during the peeling operation, leading to a reduction in quality of the thin-film single-crystal, and in an extreme case, cracks appear in the thin-film single-crystal, leading to a remarkable reduction in production yield. Thus, effective solutions of the above problems have been desired.

Roughly speaking, there are two common types of solar cells at present: solar cells using amorphous silicon and solar cells using crystalline silicon. And these solar cells are devised in various ways depending on their applications so as to make full use of their respective characteristics.

For example, amorphous silicon solar cells, which are formed by depositing an amorphous silicon film on a conductive substrate by the plasma CVD method and forming a transparent conductive layer on the amorphous silicon film, are inexpensive, lightweight, and excellent in impact resistance and flexibility compared with solar cells using crystalline silicon. Making good use of these characteristics, attempts have been made to use an amorphous silicon solar cell as a solar cell incorporated with building materials, that is, as an amorphous silicon solar cell incorporated with roof, wall, etc. of building.

In this case, a solar cell is used as a building material by bonding a reinforcing material to its non-light-receiving side via a bonding agent. Bonding a reinforcing material enhances mechanical strength of a solar cell module and prevents warps and strain, due to changes in temperature. This type of solar cell is often installed on a roof because more sunlight can be collected there. In its use as a solar cell incorporated with roofing, conventionally the installation has been performed as follows: fitting a frame to the solar cell, installing a stand on a roof, and installing the solar cell on the stand. On the other hand, the solar cell with a reinforcing material bonded thereto can be directly installed on a roof as a roofing material by bending the reinforcing material. This allows to materially reduce the raw material cost as well as the number of operational steps, and hence to provide a roof with solar cells at a low price.

In addition, the solar cell can be made lightweight since it requires neither frame nor stand. Thus, the solar cell can be treated as a metal roofing, which has lately attracted considerable attention, due to its excellent workability, lightweight and superior earthquake resistance.

The solar cell module incorporated with roofing, for example, disclosed in Japanese Patent Application Laid-Open No. 7-302924 is excellent in workability since the portions where roof materials engage with each other (the region where photovoltaic elements are not arranged) have been subjected to bending just like ordinary roofing. It is also easy to handle in terms of machining since the current molding machine used for ordinary roofing is applicable as it is. It enables the installation of a roof with solar cells at low costs.

As described above, since it is preferable that the solar cell module incorporated with roofing is constructed in such a manner as to be lightweight and machinable like ordinary roofing, the most common type of solar cell module incorporated with roofing has a construction in which a photovoltaic element is bonded to or installed on a steel plate (roofing) and subjected to insulation sealing with resin, as shown in FIGS. 10A and 10B.

FIGS. 10A and 10B are a schematic perspective view of a plate-type solar cell module incorporated with roofing and a cross-sectional view taken along the line 10B—10B of FIG. 10A, respectively. In FIGS. 10A and 10B, reference numeral 1001 denotes a surface protective material, numeral 1002 a filler material, numeral 1003 a photovoltaic element and numeral 1004 a reinforcing plate.

An amorphous silicon solar cell module, when used as a solar cell module incorporated with roofing described above, has preferable and excellent characteristics, but has problems that its photoelectric conversion efficiency (efficiency to convert optical energy into electric power, hereinafter sometimes refereed to as "conversion efficiency") is generally low compared with that of a crystalline silicon solar cell and its properties may deteriorate due to light (optical deterioration) to some extent when it is used for a long period of time.

On the other hand, for a crystalline silicon solar cell, its photoelectric conversion efficiency is generally high compared with that of an amorphous silicon solar cell and it is hard to subject to optical deterioration. Making use of these characteristics, there has been developed a crystalline silicon solar panel which enables space saving.

There remain, however, several problems to be solved when using single-crystal silicon in a solar cell module (particularly in a solar cell module incorporated with roofing).

In cases where silicon is used in a solar cell, the thickness of the single-crystal wafers commonly used is as thick as about 300 to 600 $\mu$m while the film thickness required for the absorption of incident sunlight is about 30 to 50 $\mu$m. Accordingly, if a single-crystal silicon wafer is used as a photoelectric converting layer as it is, it means single-crystal silicon is needlessly consumed.

In the present situation, where the amount of the silicon crystal used in solar cells accounts for 10% or more of its total production, there is an increasing demand for reducing its consumption. Further, in cases where a silicon wafer with thickness described above is used as a photoelectric converting layer of a solar cell as it is, since the solar cell hardly has flexibility which an amorphous silicon solar cell with an thin-film amorphous silicon layer has, it is very hard to fix the silicon wafer as it is, for example, to a curved surface. Thus the shape and installation site of the solar panel are limited, and when intending to use it in a module incorporated with building materials, it will be under many restrictions.

On the other hand, lately there have been demands for building materials and solar cells to have a wide variety of shapes, in terms of their functions and designs. In order to provide building materials and solar cells having a wide variety of shapes under such circumstances, it is hard to remain the shape of a photovoltaic element planar. And machinability should be secured for the whole region of the solar cell, including a photovoltaic element.

As an example of measures to keep up with the trend toward diversification as described above, there is disclosed a corrugated solar cell module, for example, in Japanese Patent Application Laid-Open No. 8-222752, Japanese Patent Application Laid-Open No. 8-222753 and Japanese Patent Publication No. 6-5769. In each case, in order to increase light-using efficiency, a photovoltaic element is arranged in a corrugated form, and the corrugated solar cell module is produced by following the procedure of bonding a photovoltaic element, with an adhesive agent, to a steel plate previously machined in a corrugated form.

It is, however, in amorphous silicon solar cells excellent in flexibility that the application of these techniques are feasible, and the application to crystalline silicon solar cells employing silicon wafers, which are poor in flexibility, is difficult.

One possible solution to these problems, that is, problems an amorphous silicon solar cell and a crystalline solar cell respectively have is to select thin-film single-crystal having a suitable thickness depending on the purpose for which it is used; however, with the prior arts single-crystal having a thickness of 300 $\mu$m or less is hard to produce. Specifically, in some prior art methods, since single-crystal substrates are produced in such a manner as to slice and polish an ingot single-crystal obtained by subjecting a melt of crystal material to crystal growth, single-crystal of 300 $\mu$m or less thickness are difficult to obtain. In some other methods, in order to obtain high-quality thin-film single-crystal used for special purposes, etching is conducted on the back side of a single-crystal substrate of several hundreds $\mu$m thickness; however, its production process is complicated, and hence under many restrictions. Recently, however, there have been proposed methods which make it possible to peel a thin-film single-crystal from a single-crystal substrate; for example, a method disclosed in Japanese Patent Application Laid-Open No. 7-302889 enables the peeling of thin-film single-crystal, which is formed on a single-crystal substrate by the epitaxial growth, from the substrate, and a technique disclosed in Japanese Patent Application Laid-Open No. 9-331077 enables the peeling of a portion ranging from the surface of a single-crystal substrate to a certain depth, as a thin film, from the substrate.

These types of thin-film single-crystal can be molded into a curved surface form to some extent, since it is excellent in flexibility compared with the currently used silicon wafers as described above, although it is inferior to amorphous silicon thin films. However, even in the thin-film single-crystal, when it is bent carelessly during a peeling step and during the module production process involving bending, lattice defects may appear in it, leading to a reduction in its quality, in an extreme case, cracks may appear in the same, leading to a remarkable reduction in its production yield. Furthermore, even when thin-film single-crystal is arranged in the region not subjected to bending, it can be momentarily stressed by wind pressure or vibration depending on the circumstances in which it is used, in addition, it can be subjected to bending due to its deformation with lapse of time, and hence to stress. Thus lattice defects may appear in the thin-film single-crystal, leading to a reduction in its quality, in an extreme case, cracks may appear in the same.

SUMMARY OF THE INVENTION

Accordingly, an object of the present invention is to provide, in a case of producing a thin-film single-crystal device, a method of peeling a thin-film single-crystal from a substrate without causing defects and cracks which makes possible to produce a high-quality thin-film single-crystal device in a good yield.

Another object of the present invention is to provide a high-quality thin-film single-crystal solar cell module which solves the aforementioned problems which arise during the use and production of a solar cell module having a thin-film single-crystal as at least one portion thereof and which is excellent in durability and reliability without defect and crack, and it is to provide a method of producing the module.

Specifically, the present invention provides a method of producing a thin-film single-crystal device by utilizing a thin-film single-crystal which is obtained by forming a peeling layer and a thin-film single-crystal on the surface of a substrate in this order, bonding a flexible sheet member to the surface of the above thin-film single-crystal or to the surface of a layer additionally formed on the surface of the above thin-film single-crystal, and peeling the above thin-film single-crystal together with the above sheet member from the substrate by applying force to the above sheet member in such a manner as to curve the sheet member, wherein, the peeling of the thin-film single-crystal from the substrate is carried out in such a manner that the directions of all the straight lines made on the surface of the thin film by the appearance of planes in which the thin-film single-crystal is most apt to cleave are different from the front line of the peeled portion, so as to prevent the generation of defects and cracks.

Further, the present invention provides a solar cell module with flexibility comprising a photovoltaic element having a thin-film single-crystal as at least one portion thereof, wherein the direction in which the above module is inherently apt to flex is different from the direction in which the above thin-film single-crystal is most apt to cleave.

Still further, the present invention provides a solar cell module with flexibility comprising a photovoltaic element having a thin-film single-crystal as at least one portion thereof, wherein at least one portion of a region having the thin-film single-crystal of the above module is subjected to plastic deformation, and wherein the direction of the plastic deformation is different from to the direction in which the above thin-film single-crystal is most apt to cleave.

Further, the present invention provides a method of producing a solar cell module with flexibility comprising a photovoltaic element having a thin-film single-crystal as at least one portion thereof, wherein the above thin-film single-crystal is arranged in such a manner that the direction in which the above module is inherently apt to flex is different from the direction in which the above thin-film single-crystal is most apt to cleave.

Still further, the present invention provides a method of producing a solar cell module with flexibility comprising a photovoltaic element having a thin-film single-crystal as at least one portion thereof, which comprises a step of subjecting at least one portion of a region having the thin-film single-crystal of the above module to plastic deformation, wherein the plastic deformation is carried out in such a manner that the direction of the plastic deformation is different from the direction in which the above thin-film single-crystal is most apt to cleave.

In the present invention, suitably the thin-film single-crystal has the diamond- or zinc blende-type structure.

In the present invention, preferably the thin-film single-crystal is produced by forming a peeling layer and a thin-film single-crystal layer on a substrate in this order, bonding a plate-shaped flexible member to the surface of the above thin-film single-crystal layer or to the surface of a layer additionally formed on the above thin-film single-crystal layer, and peeling the above plate-shaped member from the substrate by applying force to the plate-shaped member in such a manner as to curve the plate-shaped member. The other suitable methods of producing a thin-film single-crystal according to the present invention include, for example, a method including a polishing step and a method including an etching step.

In the present invention, preferably the angle between the direction in which thin-film single-crystal is most apt to cleave and any one of or any two of or all of the front line of a peeled portion, the direction in which the module is inherently apt to flex deflect and the direction of plastic deformation is 5 degrees or larger, more preferably 10 degrees or larger.

BRIEF DESCRIPTION OF THE DRAWINGS

FIG. 7A is a schematic cross-sectional view of a wafer during peeling and FIG. 7B is a schematic top view of the wafer during peeling of FIG. 7A;

FIG. 8A is a cross-sectional view and FIG. 8B is a top view;

FIG. 9A is a perspective view and FIG. 9B is a cross-sectional view taken along the line 9B—9B; FIG. 10A is a perspective view and FIG. 10B is a cross-sectional view taken along the line 10B—10B.

DESCRIPTION OF THE PREFERRED EMBODIMENTS

The embodiments of the present invention, including the details of how the present invention has been made, will be described in further detail. Although these embodiments will be described mostly taking an example in which the present invention is applied to a method of producing a thin-film single-crystal silicon solar cell which includes a step of obtaining thin-film single-crystal silicon by peeling a thin-film single-crystal silicon layer epitaxially grown by utilizing a porous layer, it is to be understood that the present invention is not limited in its application to the method of producing a solar cell module which includes the above step and to the solar cell module produced by the above method; it may of course be applied to a thin-film single-crystal silicon solar cell module produced by other methods as well as the methods of producing such a solar cell module. For example, the present invention may also be applied to the cases where thin-film single-crystal obtained by polishing or etching a single-crystal substrate is utilized in a solar cell module. Further, the present invention may be applied to thin-film single-crystal devices other than solar cells.

The embodiment of the present invention will be described below with reference to the steps of producing a thin-film single-crystal silicon solar cell module.

FIGS. 3A to 3E are schematic cross-sectional views illustrating one example of the steps of producing a thin-film single-crystal silicon solar cell.

First, a single-crystal silicon wafer is used as a substrate 301. A positive electric field is applied to the surface of the substrate while soaking it in hydrofluoric acid solution, so as to form a large number of fine pores irregularly connected to each other in the range of the surface to the depth of several $\mu$m to several tens $\mu$m. The region having a large number of fine pores formed in it is referred to as a porous layer 302 (step of FIG. 3A). On the porous layer 302, which still remains single-crystal, epitaxial growth is conducted by the CVD method or the liquid phase growth method to form a first single-crystal layer 303 (step of FIG. 3B), and a second single-crystal layer 304 is also formed by epitaxial growth (step of FIG. 3C).

Herein, the first single-crystal layer 303 is formed as a weak p type semiconductor (p⁻ type) and the second single-crystal layer 304 is formed as a strong n type semiconductor (n⁺ type). The first single-crystal layer 303 and the second single-crystal layer 304 form a pn junction, and the action of the junction causes photovoltage. The second single-crystal layer 304 may be formed at the step of FIG. 3C in such a manner as to form a layer containing n type dopant on the first single-crystal layer 303 and subject n type dopant of the layer to thermal diffusion.

Figure 3A:
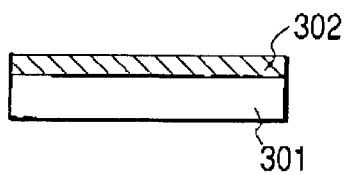
FIGS. 3A, 3B, 3C, 3D, 3E, 3F and 3G are cross-sectional views illustrating one example of the steps of producing a thin-film single-crystal solar cell.
Figure 3B:
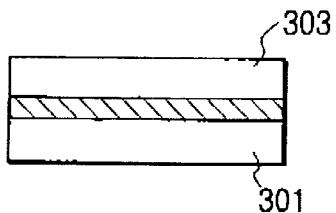
Figure 3C:
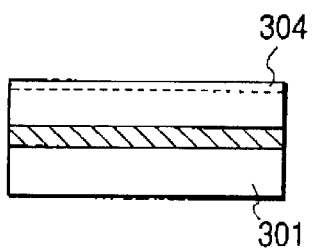
Figure 3D:
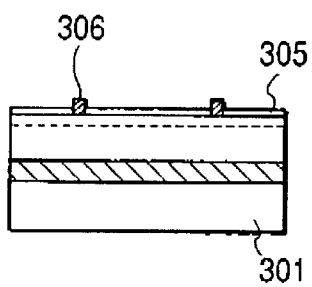
Figure 3E:
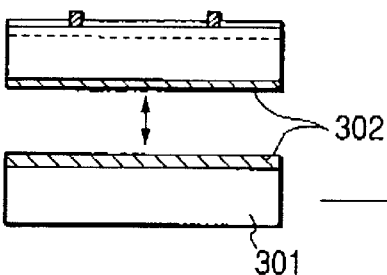
Figure 3G:

Then an anti-reflection layer 305 and a grid electrode 306 are formed on the second single-crystal layer 304 in this order (step of FIG. 3D). When applying force to the substrate 301 and/or the single-crystal layers 303 and 304, the interior of the porous layer 302, which has become brittle due to the formation of pores, fractures and the upper portion including the first single-crystal layer 303 is peeled from the main part of the substrate 301 (step of FIG. 3E). In FIGS. 3A to 3G, for easy understanding, the substrate 301 is illustrated to have the same thickness as those of the single-crystal layers 303 and 304. However, the thickness of the substrate 301 is generally about 600 $\mu$m and far thicker than those of the porous layer 302 or the single-crystal layers 303 and 304. There can sometimes remain residues of the porous layer 302 on the backside of the first single-crystal layer 303 having been peeled, the residues are not necessarily removed.

Figure 3F:
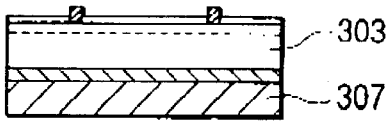

Then a backside electrode 307 is bonded to the backside of the first single-crystal 303 with a conductive adhesive having a high optical reflectance (step of FIG. 3F). Thus the thin-film single-crystal silicon solar cell is completed. The thin-film single-crystal silicon obtained in this manner is extremely of high quality, since it is obtained by conducting the epitaxial growth on a high-quality single-crystal silicon substrate. When removing the residues of the porous layer on the substrate after peeling step of FIG. 3E by means of polishing, etching, etc., so as to reclaim the substrate, the reclaimed substrate 308 can be reused at the step of FIG. 3A (step of FIG. 3G). Thus a costly substrate can be repeatedly used, which enables a significant reduction in manufacturing costs.

Figure 2A:
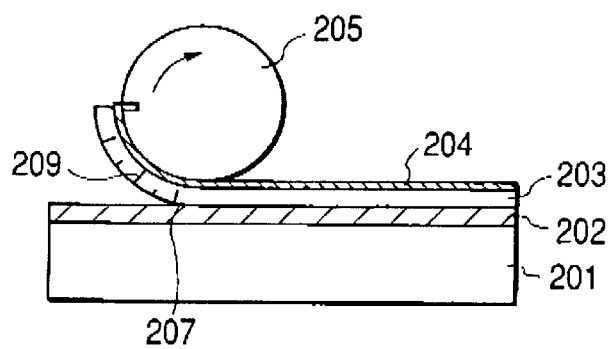
FIGS. 2A, 2B and 2C are schematic views illustrating a step of peeling a thin-film single-crystal according to a conventional method, FIG. 2A being a schematic cross-sectional view of the thin-film single-crystal during peeling, FIG. 2B being a schematic top view of the thin-film single-crystal during peeling which corresponds to FIG. 2A, FIG. 2C being a plan view of the thin-film single-crystal after peeling.
Figure 2B:
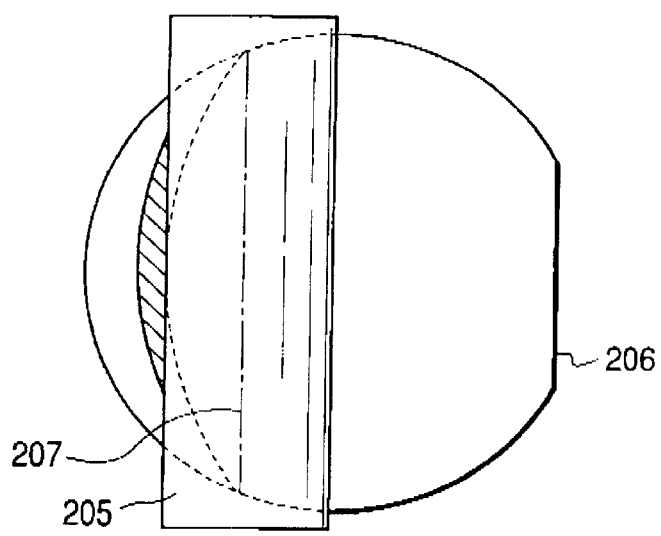
Figure 2C:
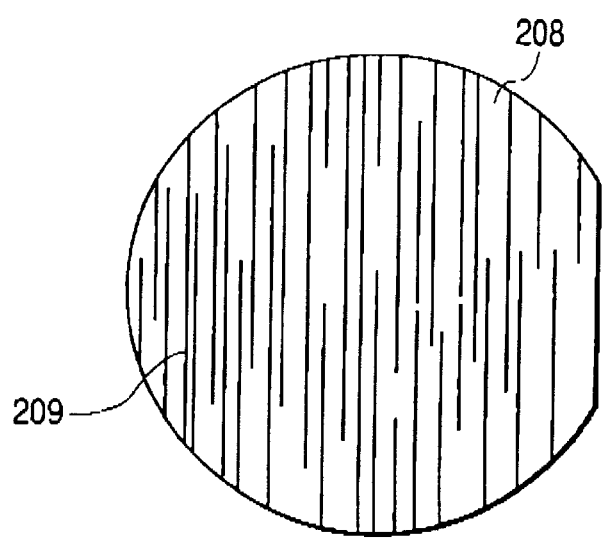

The peeling step (step of FIG. 3E) will be described in further detail with reference to FIGS. 2A to 2C, because it is a particularly important step, as compared with the other steps, which affects largely the quality, throughput and yield of thin-film single-crystal. Referring to FIGS. 2A to 2C, there are shown schematic views illustrating the peeling step, in particular, FIG. 2A is a schematic view showing the state of thin-film single-crystal silicon wafer during peeling, FIG. 2B is a schematic top view of showing the state during peeling corresponding to FIG. 2A, and FIG. 2C is a plan view of thin-film single-crystal after peeling. In FIGS. 2A to 2C, reference numeral 201 denotes a substrate, numeral 202 a peeling layer, numeral 203 a thin-film single-crystal layer, numeral 204 a sheet member, numeral 205 a peeling roller, numeral 206 a orientation flat, numeral 207 the front line of a peeled portion, numeral 208 a thin-film single-crystal after peeling, and numeral 209 cracks generated in the thin-film single-crystal. In FIG. 2A, the peeling layer 202 formed on the substrate 201 can be fracture by applying appropriate force from the outside and it corresponds to the porous layer 302 of FIGS. 3A to 3G. The thin-film single-crystal layer 203 is formed on this peeling layer. In order to peel the thin-film single-crystal 203 effectively, the method shown in FIGS. 2A and 2B should be employed. In the method, a flexible plate-shaped member (sheet member) 204 is bonded to the surface of the thin-film single-crystal layer 203. Although FIG. 2A shows that the sheet member 204 is directly bonded to the thin-film single-crystal 203, the sheet member 204 may be bonded to the surface of a layer such as anti-reflection layer and electrode, additionally formed on the thin-film single-crystal 203, as shown in FIGS. 3A to 3G. When the light enters the solar cell from the front side (the side of the anti-reflection layer 305), as shown in FIG. 3F, the sheet member 204 or, the adhesive used for bonding the sheet member 204 needs to be transparent or removal afterwards. The light may be allowed to enter from the side of the peeling layer 202. In that case, the sheet member may be opaque, but desirably it is conductive, and suitably a metal sheet is used.

When applying torque to the peeling roller 205 while allowing the peeling roller 205 to hold the end portion of the sheet member 204, which has been bonded to the thin-film single-crystal 203 directly or via some additional layer, the peeling layer 202 fractures and the thin-film single-crystal 203 begins to be peeled from the end of the substrate 201. This method is suitable for the mass production of solar cells because it can effectively peel the thin-film single-crystal layer 203 from the substrate.

The use of the above method enables the production of thin-film single-crystal to be relatively easy.

However, since this thin-film single-crystal is inherently apt to cleave in a certain direction, infinitesimal defects may occur in thin-film single-crystal 208 after the above peeling step and the subsequent solar-cell-module making step. Furthermore, they may occur in the construction or the use of the finished module, and in an extreme case, cracks 209 may occur, as shown in FIGS. 2A and 2C.

In other words, in cases where the direction in which the thin-film single-crystal is apt to cleave corresponds to or nearly corresponds to the direction in which deformation stress is applied, defects may occur, and according to the conditions, even cracks may occur in the thin-film single-crystal.

To be more concrete, in the peeling step described above, when the direction of peeling, that is, the direction in which the thin-film single-crystal is curved by a peeling roller corresponds to or nearly corresponds to the direction in which the thin-film single-crystal is apt to cleave, defects or cracks may occur in the thin-film single-crystal.

Further, in cases where a module is subjected to plastic deformation in the module-making step, or in cases where the thin-film single-crystal is fixed to a backing plate (reinforcing plate) subjected to plastic deformation, when the direction in which the backing plate is deformed corresponds to or nearly corresponds to the direction in which the thin-film single-crystal is apt to cleave, defects or cracks may occur in the thin-film single-crystal in the step of plastic deformation after fixing the thin-film single-crystal to the backing plate (i.e., bending step), or in the step of fixing the thin-film single-crystal to the backing plate subjected to plastic deformation.

When being stressed, a solar cell module is inherently apt to cleave in a certain direction which depends on the shape. Thus, when the module is stressed during its construction (for example, during its installation on a roof or the outer wall), and at the same time the direction in which the module is apt to deflect corresponds to or nearly corresponds to the direction in which thin-film single-crystal fixed into the module is apt to cleave, flex and cracks may occur in the thin-film single-crystal fixed into the module is apt to cleave, flex and cracks may occur in the thin-film single-crystal due to the flexibility of the module during the construction.

Even after installation of the module, while being used for a long period time, they module may be flexed by the stress due to wind pressure, vibration, etc., and this depends on the circumstances in which it is used. When the direction in which the module if flexed by the stress due to vibration, etc. corresponds to or nearly corresponds to the direction in which the thin-film single-crystal fixed into the module is apt to cleave, defects and cracks may occur in the thin-film single-crystal after using for a long time.

Figure 9A:
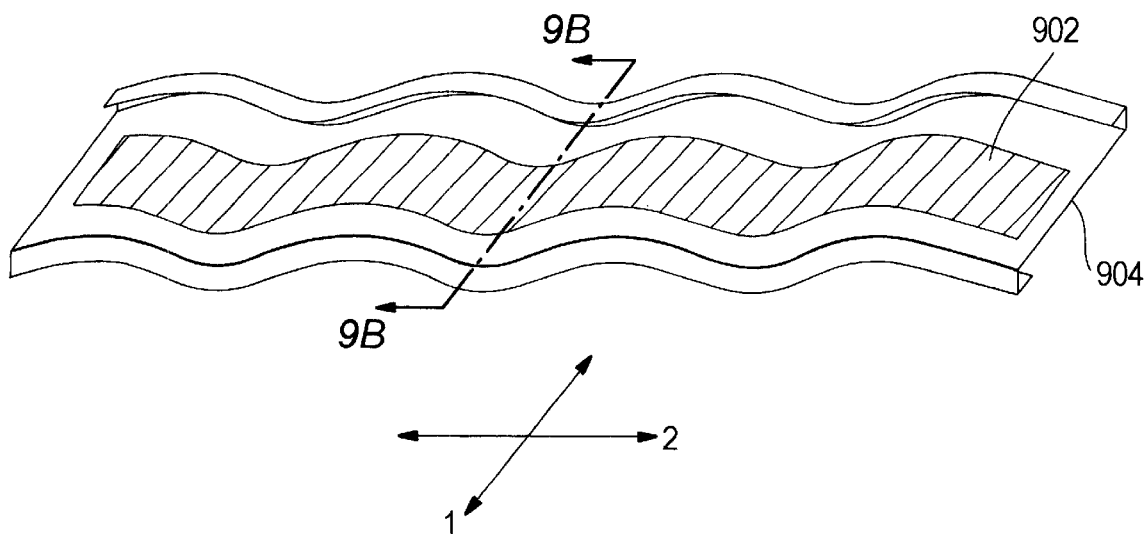
FIGS. 9A and 9B are schematic views of a corrugated solar cell module incorporated with roofing.
Figure 9B:
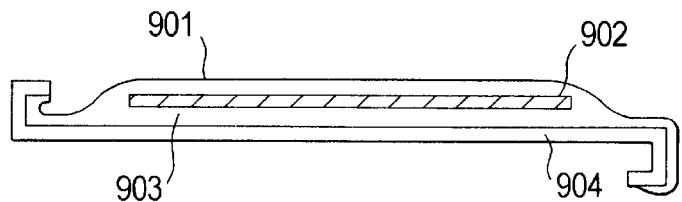

This phenomenon will be described in further detail with reference to FIGS. 9A to 10B. Referring to FIGS. 9A and 9B, there are shown schematic views of a corrugated solar cell module incorporated with roofing, in particular, FIG. 9A is a perspective view of the corrugated solar cell module incorporated with roofing and FIG. 9B is a cross-sectional view taken along the line 9B—9B of FIG. 9A. In FIGS. 9A and 9B, reference numeral 901 denotes a surface protective material, numeral 902 a photovoltaic element, numeral 903 a filler material, and numeral 904 a reinforcing plate.

Figure 10A:
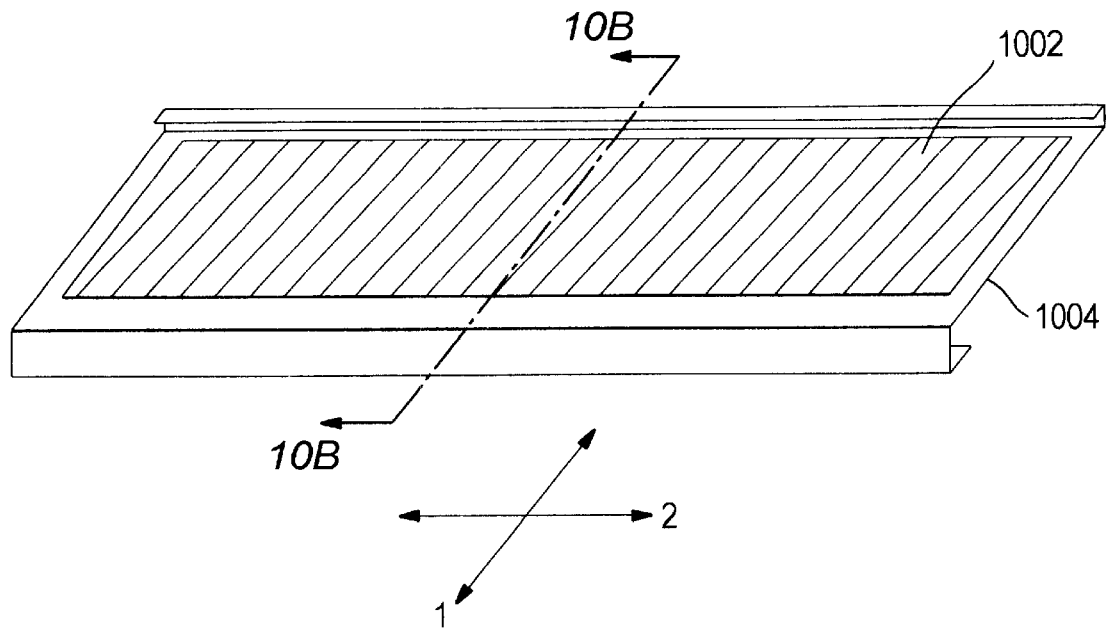
FIGS. 10A and 10B are schematic views of a plate-shaped solar cell module incorporated with roofing.
Figure 10B:
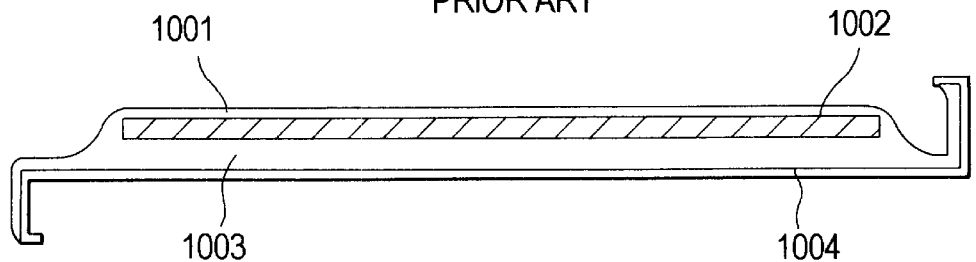

Referring to FIGS. 10A and 10B, there is shown schematic views of a planar solar cell module incorporated with roofing as described above, in particular, FIG. 10A is a perspective view of the plate-shaped solar cell module incorporated with roofing and FIG. 10B is a cross-sectional view taken along the line 10B—10B of FIG. 10A.

In FIGS. 9A and 10A, reference numerals 1 and 2 denote directions.

In the corrugated module as shown in FIGS. 9A and 9B, for example, the photovoltaic element including a thin-film single-crystal layer as at least one portion thereof is arranged on the corrugated portion (curved surface portion) in such a manner that it is curved along the curved surface of the reinforcing plate. Accordingly, the photovoltaic element arranged in the corrugated portion is inevitably stressed in the curved direction (the direction 2) during and after bending. Accordingly, if the direction 2 corresponds to or nearly corresponds to the direction in which the thin-film single-crystal constituting at least one part of the photovoltaic element is apt to cleave, defects and cracks may gradually occur, for the reasons described above, with the lapse of time while the module is being used for a long period time.

Even in the plate-type module as shown in FIGS. 10A and 10B, when it has an aptitude to be flexed either in the direction 1 or in the direction 2 (in FIGS. 10A and 10B, it is apt to be flexed in the direction 1), it is flexed by the stress due to wind pressure, vibration, etc. depending on the circumstances in which it is used. If the direction in which the module is flexed by the stress due to vibration, etc. corresponds to or nearly corresponds to the direction in which the thin-film single-crystal is apt to cleave, defects and cracks may occur with lapse of time while the module is being used for a long period time.

(Experiment)

To solve these problems, the present inventors first used various types of silicon wafers as the substrate to form thin-film single-crystal silicon layers and made an experiment to examine conditions of cracking in single-crystal layers under application of strains from various directions so as to bend the thin-film single-crystal layers in the peeling step of the above thin-film single-crystal layers. The experimental result is shown in Table 1.

TABLE 1

| Used Plane of Silicon | Main Cracking Direction |
| --- | --- |
| {100} | <110> |
| {110} | <112>, <110> |
| {111} | <110> |

Here, the direction in a crystal is expressed as <100>. <100> generally represents the [100] direction and those equivalent to the [100] from the symmetry of crystal structures. Besides, the orientation of a crystal face is expressed as {100}. {100} generally represents the (100) face orientation and those equivalent to the (100) from the symmetry of crystal structures. The result of Table 1 has revealed that the direction of cracking in a thin-film single-crystal silicon coincides with that known to be the easiest in cleavage for individual wafers used as the substrate. Furthermore, since cracking occurred easily in some cases and hardly in others when the thin-film single-crystal were peeled from one and the same substrate, the present inventors further made a detailed examination, thus revealing that an ease of cleavage depends on the direction of peeling.

Figure 1A:
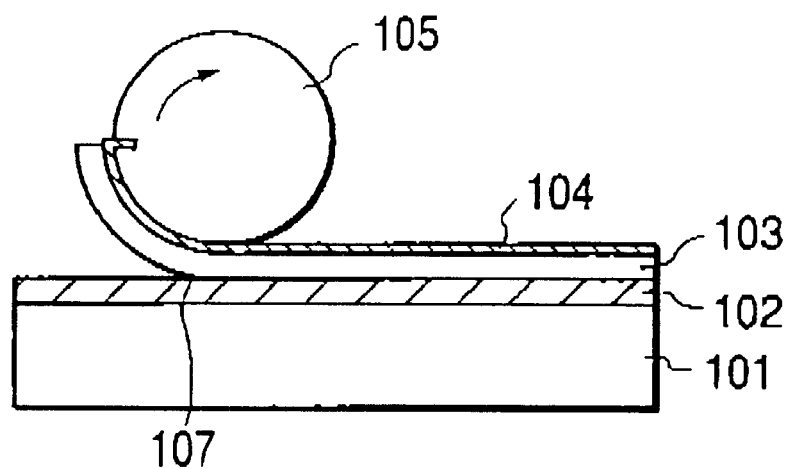
FIGS. 1A and 1B are schematic views illustrating a step of peeling a thin-film single-crystal, FIG. 1A being a schematic cross-sectional view of the thin-film single-crystal during peeling, FIG. 1B being a schematic top view of the thin-film single-crystal during peeling which corresponds to FIG. 1A.
Figure 1B:
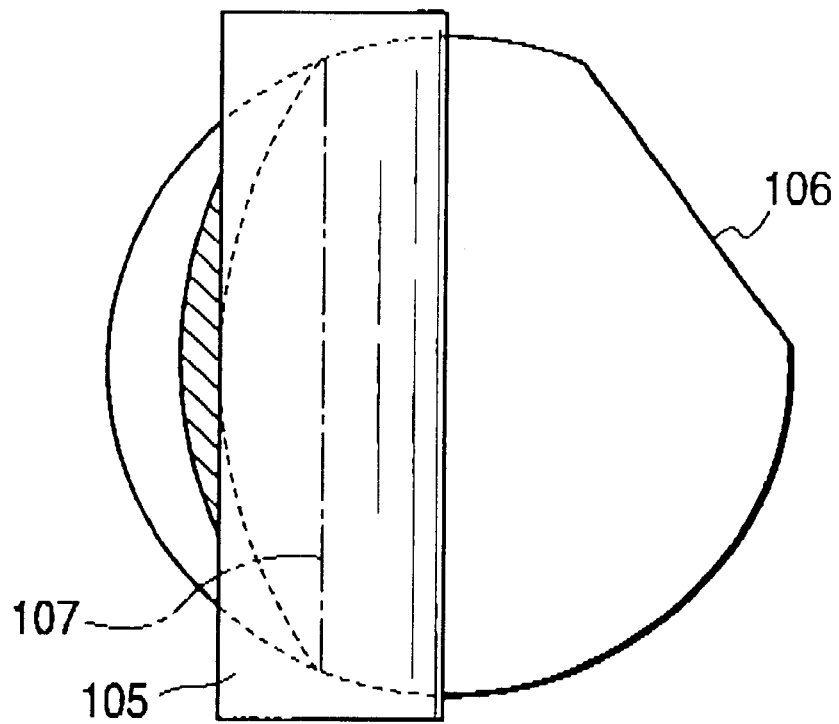

Namely, when the front line 207 of a peeled portion coincided with the direction of easily cleaving in FIG. 2A, a tendency of significantly cracking was observed. To be specific, in this case, an ease of cracking is attributable to the fact that the substrate 201 assumes the face orientation of {100}, the orientation flat 206 is oriented in <100> and the front line 207 of peeling is parallel to the direction <100> of easily cleaving. An improvement in this point is the peeling method shown in FIGS. 1A and 1B. FIGS. 1A and 1B are schematic views of a peeling step, FIG. 1A is a schematic sectional view showing the situation during the peeling and FIG. 1B is a schematic top view showing the situation during peeling, corresponding to FIG. 1A). In FIGS. 1A and 1B, numerals 101 denotes a substrate, 102 a peeling layer, 103 a thin-film single-crystal silicon layer, 104 a sheet member, 105 a peeling roller, 106 orientation flat, and 107 the front line of peeling, respectively. Here, the front line 107 of peeling was intentionally deviated from <110> and cracking hardly occurred in this case. Also in case of using a substrate of another face orientation, a similar tendency was observed and experiments were made with varying angles between the front line 107 of peeling and the direction of easiest occurring in cleavage. At an angle of not smaller than 5 degrees, the cracking noticeably decreased and hardly occurred at an angle of not smaller than 10 degrees.

Figure 4:
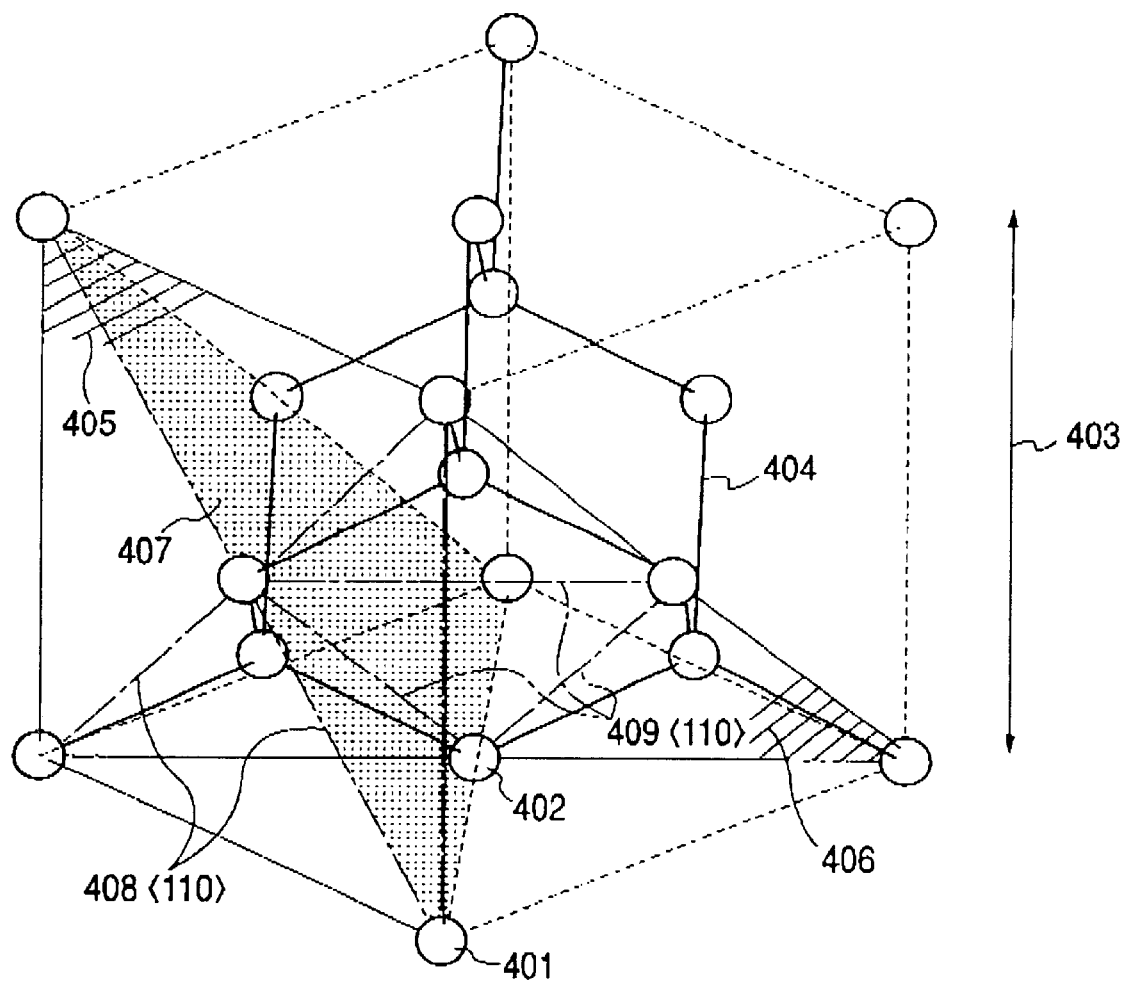
FIG. 4 is a schematic perspective cross-sectional view illustrating a unit lattice of crystal having a diamond structure.
Figure 5A:
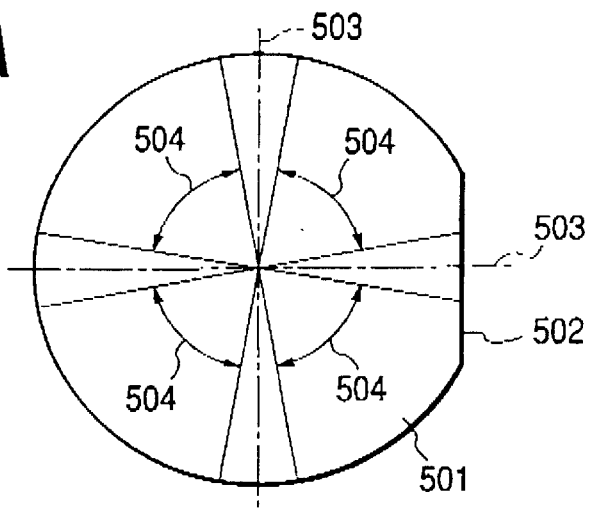
FIG. 5A is a schematic top view of a wafer cut in the {100} plane ({100} wafer) and FIG. 5B is a schematic top view of a wafer cut in the {111} plane ({111} wafer)
Figure 5B:
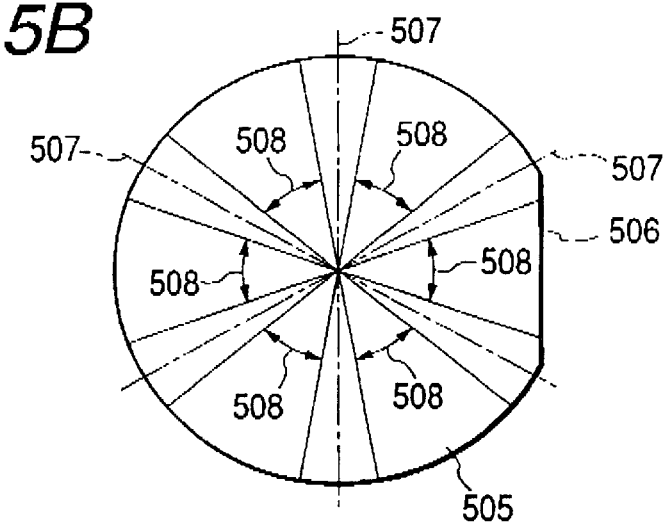

This result is anticipated to be generalizable. This point will be described referring to FIG. 4. FIG. 4 is a schematic perspective view showing the unit lattice of a crystal having the diamond type structure. With a crystal having the diamond type structure shown in FIG. 4, like silicon, the cleavage occurs easily on the {111} face. Thus, even for a wafer with the surface having any direction, the direction in which the {111} face comes to appear for the wafer is that of easily cracking and it is only necessary to perform the peeling so as to deviate the front line 107 of peeling from the direction of easily cracking. Using FIGS. 4, 5A and 5B, an example of predicting a direction of easily cracking for a wafer with a general face orientation will be illustrated. In FIG. 4, numerals 401 denotes an atom on the surface of a lattice, 402 an atom inside a lattice, 403 a lattice constant, and 404 a covalent bond, respectively. Besides, numerals 406 and 407 denote the {111} face, which is the easiest in cleavage, whereas numeral 405 denotes the {100} face. In case of cutting a crystal in this face, the {111} face 407 appears as the straight line directing as designated with numeral 408 (<110> direction). However, the {111} face has several equivalent faces and numeral 408 denotes two types of straight lines, but any of them is represented as the <110> direction. FIG. 5A is a view of a wafer 501 cut along the {100} face ({100} wafer) viewed from above, where numeral 502 denotes an orientation flat <110>, and 503 the <110> direction. According to findings of the present inventors, the front line of peeling has only to slant to this direction by 5 degrees or greater and preferably by 10 degrees or greater. Since there are two directions equivalent to <110>, however, a preferable direction for the front line of peeling finally becomes as designated with the angle 504 of a difficulty in cracking. In FIG. 4, numeral 406 denotes a {111} face equivalent to the face 407. In case of cutting a crystal on this face, the {111} face 407 appears as the straight line directing as designated with numeral 409 (<110> direction). However, there are faces equivalent to the {111} face and three types of straight lines are designated with numeral 408, any of which is expressed in terms of <110>. FIG. 5B is a schematic view of a wafer cut along the face {111} ({111} wafer) viewed from above, where numeral 506 denotes an orientation flat <110>, and 507 a direction of <110>. In this case, the front line of peeling preferably directs as designated with the angle 508 of a difficulty in cracking.

The above way of thinking seems applicable to cases of peeling a thin-film single-crystal layer of others than silicon having another structure than the diamond type structure. With zinc-blende type structure crystals of III–V semiconductors such as GaAs and InP, II–VI semiconductors such as ZnSe and InS, for example, the {110} face is said to be the easiest in cleavage and a similar analysis suggests it only necessary to deviate the angle of the front line of peeling from the direction in which this face appears on the surface of a substrate.

Figure 6:
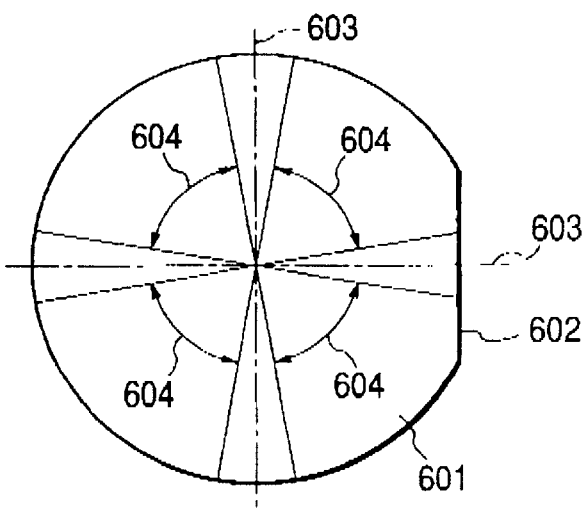
FIG. 6 is a schematic top view of a wafer cut in the {100} plane ({100} wafer)

FIG. 6 is a schematic view of a zinc-blende type structure semiconductor wafer 601 ({100} wafer) cut along {100} viewed from above, where numerals 602 and 603 denote an orientation flat <100> and a direction of <100>, respectively. In this case, the front line of peeling preferably directs as designated with the angle 604 of a difficulty in cracking.

Figure 7A:
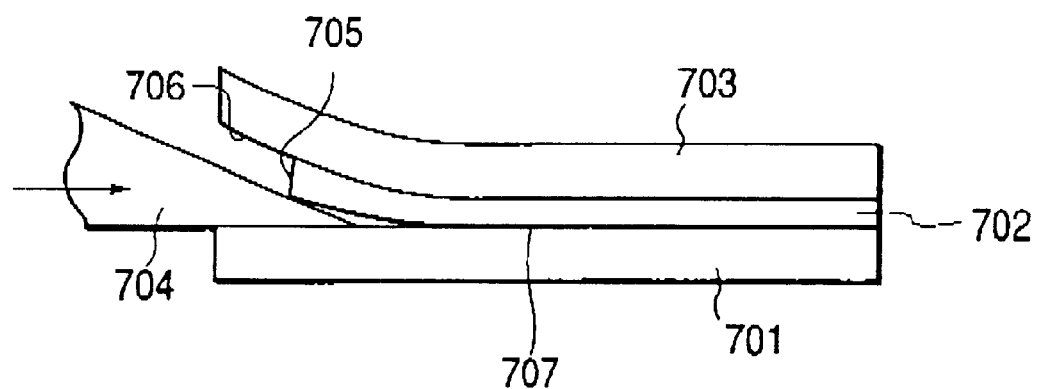
FIGS. 7A and 7B are schematic views illustrating one example of the peeling step, in particular.
Figure 7B:
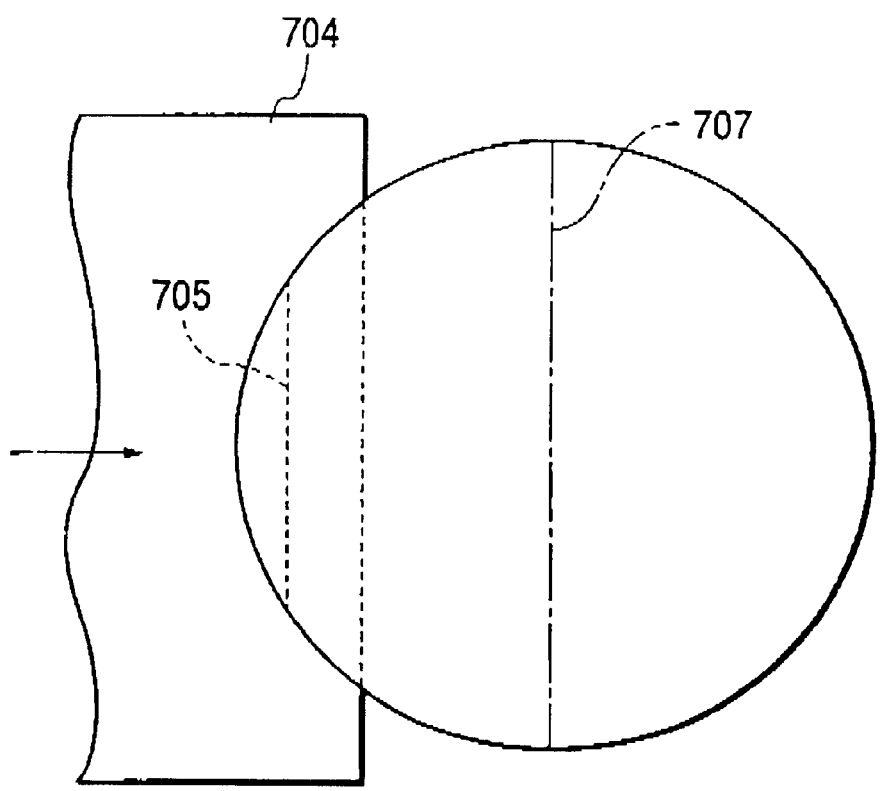

Another example of peeling method applicable to the present invention will be described referring to FIGS. 7A and 7B. FIGS. 7A and 7B are schematic views of one example of a peeling step other than the above, where FIG. 7A is a schematic sectional view showing a situation during the peeling and FIG. 7B is a schematic top view of the situation during the peeling corresponding to FIG. 7A. In FIGS. 7A and 7B, numeral 701, denotes a substrate, 702 a thin-film single-crystal layer, 703 a quartz glass support plate, 704 a peeling wedge, 705 a front edge removed part, 706 a taper part and a front of peeling, respectively. In this example, a portion of the thin-film single-crystal layer (front end removed portion 705) is removed beforehand by the etching or the like, a quartz glass support plate 703 with the taper part 706 is glued onto it and the thin-film single-crystal layer 702 is peeled from the substrate 701 by driving a peeling wedge 704 from the side of the front end removed part 705. By the way, in this example, the thin-film single-crystal layer 702 is directly provided on the substrate 701, but a peeling layer may be provided between them to drive a wedge 704 there. Also in such an example of peeling, the effect of the present invention can be obtained by deviating the front line 707 of peeling from the direction in which the thin-film single-crystal layer 702 is apt to cleave.

As mentioned above, the thin-film single-crystal is greatly excellent in flexibility in contrast to a conventional crystal substrate, but cracking may occur depending on a bending stress and further this ease of cracking was found to strongly correlate with the direction of stress application. Thus, it was found that by controlling the direction of a stress applied to a thin-film single-crystal, the flexibility of the thin-film single-crystal can be utilized more effectively.

Besides, in the above description, a method for obtaining a thin-film single-crystal by forming a thin-film single-crystal layer by the epitaxial growth and peeling the thin-film single-crystal layer from the substrate used for the growth after the completion of growth was specifically described referring to examples. In fabricating a thin-film single-crystal for a solar cell module, the effect of the present invention can be obtained by disposing this thin-film single-crystal so as not to make its easiest cleaving direction coincident with the bending easy direction peculiar to the module, not only for the one prepared by peeling as mentioned above but also for the one is obtained by the grinding step or by the etching step.

By showing examples of the present invention, specific arrangements and effects of the present invention will be further described below.

EXAMPLE 1

This example is an example of the present invention applied to the manufacturing of a thin-film single-crystal silicon solar cell shown in FIGS. 3A to 3G. A p$^+$ silicon wafer 301 of the face orientation {111} is dipped into a liquid mixture of hydrofluoric acid and isopropyl alcohol (liquid mixture of 49% by weight of hydrofluoric acid (balance:water) and 99.9% pure isopropyl alcohol; volume ratio: 1:0.1), and anodization was carried out with this wafer 301 employed for the positive electrode and a platinum plate employed for the negative electrode. As a result of 5 minute current application at a current density of 1 A/cm$^2$, minute pores complexly entangled down to a depth of about 5 $\mu$m from the surface were formed to produce a porous layer 302. On the surface of this porous layer 302, an approx. 30 $\mu$m thick p-type thin-film single-crystal layer 303 was epitaxially grown in a liquid phase growth apparatus using a melt formed by dissolving p-type silicon into a solvent of indium.

It was confirmed by the electron beam diffraction method that a silicon layer 303 was epitaxially grown. Besides, it was confirmed on Hall-effect measurements of a thin-film single-crystal layer peeled by a method according to the present invention in this situation that this thin-film single-crystal 303 was of p type. On the surface of the p-type thin-film single-crystal silicon layer 303, an approx. 0.2 $\mu$m thick n$^+$-type thin-film single-crystal silicon layer 304 was epitaxially grown in a liquid phase growth apparatus using a melt formed by dissolving n$^+$-type silicon into a solvent of tin. On this surface, an approx. 70 nm thick silicon nitride layer was deposited as the anti-reflection layer 305 by the sputtering. Furthermore, a through hole was formed on this surface and a grid electrode 306 was formed by the printing, onto which a 0.2 mm thick PET film was glued as a sheet member 104 as shown in FIG. 1A by using EVA for the adhesive layer (not shown).

This sheet member was seized at its end with a 100 mm diameter peeling roller 105 and rolled up from the periphery. At this time, it was rolled up with attention paid to the position of seizing the sheet member and to the direction of the shaft of the peeling roller 105 so that this shaft always directs at an angle of 45 degrees to the orientation flat 106 (orientation: <110>) of a wafer. Together with this, the thin-film single-crystal silicon began to be peeled at the part of the porous layer 302. At that time, the direction of the front line 107 of peeling was parallel to that of the shaft of the peeling roller 105. After the roll-up was continued as it was, the whole thin-film single-crystal silicon layer was peeled from the substrate.

To this back face of the obtained silicon, a back electrode 307 of stainless steel plate was glued using a conductive adhesive containing copper as a main component. On measurements using a solar simulator adjusted to AM 1.5 in this situation, a conversion efficiency of 15% was obtained. With this solar cell, the conversion efficiency amounted to 14.0% under environments comprising a temperature of 45° C. and a humidity of 85%, which value was sufficiently equal to practical use. Next, when the wafer after the completion of peeling was dipped into fluoronitric acid etching liquid, the porous layer residue remaining on the wafer surface disposed and disappeared and the surface of the reclaimed substrate (wafer) 308 became a mirror surface. The solar cell obtained by repetition of the above steps using this wafer also manifested a conversion efficiency of 14.8%, thereby revealing the repetitive usability of a wafer.

On the other hand, when a solar cell was manufactured as a trial just in the same manner as the above except that such roll-up in peeling a thin-film single-crystal layer was carried out so as to keep the shaft of a peeling roller in parallel with the orientation flat, cracking occurred in the peeled thin-film single-crystal and wire breaking of a grid electrode was also observed. The conversion efficiency of this solar cell was 4.5% and the output became unobtainable by any means at a temperature of 45° C. and a humidity of 85%. Furthermore, on a wafer after the peeling, the single-crystal layer remained in flakes and a clean face could not be exposed by the etching. Besides, when roll-up was carried out so as to keep the shaft of a peeling roller always at an angle of 5 degrees to the orientation flat 106 of the wafer, seemingly no cracking occurred in the peeled thin-film single-crystal layer, the conversion efficiency was 14.5% and a function equal to practical use was observed, but under environments comprising a temperature of 45° C. and a humidity of 85%, the conversion efficiency significantly lowers to 5.5%. It is thinkable that minute, hardly observable defects occurred. Such a marked lowering in function under a higher temperature and a higher humidity became unobservable by carrying out such roll-up so as to keep the shaft of a peeling roller always at an angle of 10 degrees to the orientation flat 106.

EXAMPLE 2

This example is an example of the present invention applied to the manufacturing of a solar cell using a thin-film single-crystal GaAs. A p-type GaAs wafer of the face orientation {100} was prepared. On the surface of this substrate, a 0.1 μm thick n$^+$-type GaAs layer was epitaxially grown in a liquid phase growth apparatus using a melt formed by dissolving arsenic and traces of silicon in a solvent of gallium. Thereafter, to the surface of this wafer, $5 \times 10^{16}/cm^2$ of hydrogen ions were implanted at an acceleration voltage of 500 keV. Then, on this surface, a 70 nm thick silicon nitride layer was formed as the anti-reflection layer. On that occasion, the substrate temperature was set to 450° C. After a through hole was formed on this surface, a grid electrode was formed by printing, onto which a 0.3 mm thick polycarbonate film was glued as such a sheet member 104 as shown in FIG. 1A by using an acryl adhesive as the adhesive layer (not shown).

This sheet member was seized at its end with a 100 mm diameter peeling roller 105 and rolled up from the periphery. At this time, it was rolled up with attention paid to the position of seizing the sheet member and to the direction of the shaft of the peeling roller 105 so that this shaft always directs at an angle of 45 degrees to the orientation flat 106 (orientated in <100>) of a wafer. Together with this, the single-crystal layer began to be peeled at a depth of 5 μm from the surface of the single-crystal GaAs wafer. This is attributable to the fact that hydrogen ions were concentrated at a depth of 5 μm from the surface by implanting hydrogen ions from the surface and aggregated at the time of sputtering of silicon nitride to apply a stress to the crystal structure, resulting in the formation of a peeling layer, and thus the single-crystal layer was peeled at this part on the occasion of further application of an external force. Meanwhile, the direction of the front line 107 of peeling was parallel to that of the shaft of the peeling roller 105.

After the roll-up was continued as it was, the thin-film single-crystal GaAs with a portion of thickness of 5 μm apart from the surface and the GaAs epitaxial growth layer stacked thereon was peeled from the substrate. To this base face, a back electrode of stainless steel plate was glued using a conductive adhesive containing copper as a main component. On measurements using a solar simulator adjusted to AM 1.5 in this situation, a conversion efficiency of 18% was obtained. Next, when the wafer after the completion of peeling was dipped into fluoronitric acid etching liquid, the wafer surface became a mirror surface. The solar cell obtained by repetition of the above steps using this wafer also manifested a conversion efficiency of 17.5%, thereby revealing the repetitive usability of a wafer.

On the other hand, when a solar cell was manufactured as a trial in the same manner as the above except that such roll-up in peeling a thin-film single-crystal layer was carried out so as to keep the shaft of a peeling roller in parallel with the orientation flat, cracking occurred in the peeled thin-film single-crystal layer and wire breaking of a grid electrode was also observed. In addition to this, the single-crystal layer remained in flakes on a wafer after the peeling and a clean face could not be exposed by the etching.

EXAMPLE 3

This example is an example of the present invention applied to the production of an image display element member with a thin-film single-crystal layer for forming an optically transparent driving circuit which is glued to quartz glass.

A p$^+$ silicon wafer of the face orientation {100} was dipped into a liquid mixture of hydrofluoric acid and isopropyl alcohol (liquid mixture of 49% by weight of hydrofluoric acid (balance:water) and 99.9% pure isopropyl alcohol with a volume ratio of 1:0.1) and anodization was carried out with this wafer employed for the positive electrode and a platinum plate employed for the negative electrode. As a result of 5 minutes current application at a current density of 1 A/cm², minute pores complexly entangled down to a depth of approx. 5 μm from the surface were formed to produce a porous layer. On the surface of this porous layer, an approx. 0.5 μm thick p-type thin-film single-crystal layer was epitaxially grown using trichlorosilane ($SiHCl_3$) at a substrate temperature of 1000° C. by the thermal CVD process. Thereafter, the surface of this thin-film single-crystal was fully cleaned, a flexible quartz glass support plate (sheet member) with the surface kept hydrophilic was bonded to the cleaned face by heating and the quartz support plate was strongly adsorbed to the surface of the thin-film single-crystal.

Thereafter, by the method shown in FIGS. 7A and 7B, this thin-film single-crystal was peeled from the silicon wafer. In FIG. 7A, the silicon wafer is indicated as a substrate 701. The back face of this wafer is strongly adsorbed onto a table by a method such as vacuum adsorption or electromagnetic adsorption. In this situation, a peeling wedge 704 was inserted from the left. To make a hold for the insertion, it is allowable to remove the front end of the thin-film single-crystal 702 to form a space (705) by removing the front end or to form a taper part 706 at the front end of the quartz glass support plate 703. When the wedge 704 intruded, the thin-film single-crystal layer 702 and the wafer 701 began to be peeled at the part of the porous layer (not shown) of their interface. On this occasion, the front line 707 of peeling was so arranged as to make an angle of 45° to the direction {110} of the wafer.

After the residue of the porous layer on that surface was removed, the thin-film single-crystal layer peeled thus was annealed at 1050° C. in the atmosphere of hydrogen, thereby leading to an almost perfect plane of the surface. Although the thin-film layer 702 is a perfect single-crystal layer, since the thin film is only 0.5 μm thick, it can be made optically transparent and its unnecessary part is easily removable after forming a circuit therein, thereby favoring a liquid crystal display element driving circuit to be built in. Moreover, since the wafer can be reclaimed and repetitively used, the production cost can also be reduced.

On the other hand, in the case of making the front line 707 of peeling coincident with the {100} direction, striped irregularities extending in the {110} direction were observed on the surface of the thin-film single-crystal layer and a good surface could not be obtained even after the hydrogen annealing.

EXAMPLE 4

This example is an example of the present invention applied to the manufacturing of the thin-film single-crystal silicon solar cell shown in FIGS. 3A to 3G. A p⁺ silicon wafer 301 of the face orientation {111} was dipped into a liquid mixture of hydrofluoric acid and isopropyl alcohol, and anodization was carried out with this wafer 301 employed for the positive electrode and a platinum plate employed for the negative electrode. As a result of 10 minute current application at a current density of 0.8 A/cm², minute pores complexly entangled down to a depth of approx. 5 μm from the surface were formed to produce a porous layer 302. On the surface of this porous layer 302, an approx. 25 μm thick p-type thin-film single-crystal layer 303 was epitaxially grown in a liquid phase growth apparatus using a melt formed by dissolving p-type silicon into a solvent of indium. The epitaxial growth was confirmed by the electron beam diffraction method. Besides, it was confirmed on Hall-effect measurements of a thin-film single-crystal layer peeled by a method according to the present invention in this situation that this thin-film single-crystal 303 was of p type. On the surface of the p-type thin-film single-crystal layer 303, an approx. 0.2 μm thick n⁺-type thin-film single-crystal silicon layer 304 was epitaxially grown in a liquid phase growth apparatus using a melt formed by dissolving n⁺-type silicon into a solvent of tin. On this surface, an approx. 70 nm thick silicon nitride layer was deposited as the anti-reflection layer 305 by the sputtering. After a through hole was formed on this surface, a grid electrode 306 was formed by the printing, onto which a 0.2 mm thick PET film was glued as a sheet member 104 as shown in FIG. 1A by using EVA for the adhesive layer (not shown). This sheet member was seized at its end with a 100 mm diameter peeling roller 105 and rolled up from the periphery. At this time, it was rolled up with attention paid to the position of seizing the sheet member and to the direction of the shaft of the peeling roller 105 so that this shaft always directs at an angle of 45 degrees to the orientation flat 106 (oriented in <110>) of a wafer. Together with this, the thin-film single-crystal silicon began to be peeled at the part of the porous layer 302. At that time, the direction of the front line 107 of peeling was parallel to that of the shaft of the peeling roller 105. After the roll-up was continued as it was, the whole thin-film single-crystal silicon was peeled from the substrate. To this back face of the silicon, a back electrode 307 of stainless steel plate was glued using a conductive adhesive containing copper as a main component. Under environments comprising a temperature of 25° C. and a humidity of 50% in this situation, measurements were carried out using a solar simulator adjusted to AM 1.5. Next, similarly with this solar cell, photoelectric conversion efficiencies were measured under environments comprising a temperature of 45° C. and a humidity of 85%. These photoelectric conversion efficiencies were compared. The result was shown in Table 2.

As evident from Table 2, setting the photoelectric conversion efficiency at a temperature of 25° C. and a humidity of 50% to 1 in a solar cell according to the present invention, the relative value became 0.98 under environments comprising a temperature of 45° C. and a humidity of 85%, but this value was found sufficiently equal to practical use.

TABLE 2

|  | Temperature of 25° C., Humidity of 50% | Temperature of 45° C., Humidity of 85% |
| --- | --- | --- |
| Example 4 | 1.0 | 0.98 |
| Example 5 | 0.98 | 0.97 |
| Comparative Example 1 | 0.3 | 0.05 |

N.B.: Numerical values in Table 2 indicate relative values of photoelectric conversion efficiencies for individual samples under individual conditions on setting the photoelectric conversion efficiency of Example 4 at a normal temperature and a normal humidity to 1.0.

EXAMPLE 5

When dipping the wafer used in Example 4 after the completion of peeling into a fluoronitric acid-based etching solution, the residue of the porous layer remaining on the surface of a wafer dissolved away and the wafer surface became a mirror surface, thereby providing a reclaimed wafer 308. Using this wafer 308, a solar cell was manufactured through the repetition of steps similar to those of Example 4 and photoelectric conversion efficiencies of the obtained solar cell were measured similarly. The result was shown in Table 2 together with that of Example 4. As evident from Table 2, photoelectric conversion efficiencies took relative values of 0.98 and 0.97 on setting the photoelectric conversion efficiency of the first solar cell prepared in Example 4, measured at a temperature of 25° C. and a humidity of 50%, to 1, thereby revealing the repetitive usability of the wafer.

COMPARATIVE EXAMPLE 1

On the other hand, when a solar cell was manufactured as a trial n the same manner as of Example 4 except that such roll-up in peeling a thin-film single-crystal layer was carried out so as to keep the shaft of a peeling roller in parallel with the orientation flat, cracking occurred in the peeled thin-film single-crystal layer and wire breaking of a grid electrode was also observed. As mentioned above, photoelectric conversion efficiencies were measured for this solar cell. The result is shown in Table 2 together with those of Examples 4 and 5. As evident from Table 2, the photoelectric conversion efficiency takes a relative value of 0.3 for Example 4 and hardly any output became obtainable at a temperature of 45° C. and a humidity of 85% (relative value of 0.05). Furthermore, the single-crystal layer remained in flakes on a wafer after the peeling, a clean face could be exposed by the etching and a substrate could be reclaimed.

EXAMPLE 6

A solar cell was manufactured as a trial in the same manner as in Example 4 except for a change in the oriented angle of the shaft of a peeling roller relative to the orientation flat 106. When such a roll-up was carried out so as to keep the shaft of a peeling roller always at an angle of 5 degrees to the orientation flat, seemingly no cracking was observed and the photoelectric conversion efficiency took a relative value of 0.96 as well, which exhibited a function equal to practical use but significantly lowered to a relative value of 0.36 under environments comprising a temperature of 45° C. and a humidity of 85%. Hardly observable minute defects seemed to be generated. Such a significant function deterioration at high temperatures and high humidities became invisible by carrying out a roll-up so as to keep the shaft of a peeling roller at an angle of 10 degrees to the orientation flat 106. It was found from this example that an angle of the shaft of a peeling roller relative to the orientation flat 106 was preferably 5 degrees or more and more preferably 10 degrees or more.

EXAMPLE 7

This example is an example of the present invention applied to the manufacturing of a solar cell using a thin-film single-crystal GaAs. A p-type GaAs wafer of the face orientation {100} was prepared. On the surface of this substrate, a 0.1 μm thick n$^+$-type GaAs layer was epitaxially grown in a liquid phase growth apparatus using a melt formed by dissolving arsenic and traces of silicon in a solvent of gallium. Thereafter, to the surface of this wafer, $5 \times 10^{16}$/cm$^2$ of hydrogen ions were implanted at an acceleration voltage of 500 keV. Then, on this surface, a 70 nm thick silicon nitride layer was formed as the anti-reflection layer. On that occasion, the substrate temperature was set to 450° C. After a through hole formed on this surface, a grid electrode formed by printing, onto which a 0.3 mm thick polycarbonate film was glued as such a sheet member 104 as shown in FIG. 1A by using an acryl-based adhesive as the adhesive layer (not shown). This sheet member was seized at its end with a 100 mm diameter peeling roller 105 and rolled up from the periphery. At this time, it was rolled up with attention paid to the position of seizing the sheet member and to the direction of the shaft of the peeling roller 105 so that the shaft always directs at an angle of 45 degrees to the orientation flat 106 (oriented in <100>) of a wafer. Together with this, the single-crystal layer began to be peeled at a part of thickness of 5 μm apart from the surface of the single-crystal GaAs wafer. This is attributable to the fact that hydrogen ions were concentrated at a depth of 5 μm from the surface by implanting hydrogen ions from the surface and aggregated at the time of sputtering of silicon nitride, resulting in the formation of a peeling layer under application of a stress on the crystal structure, and thus the single-crystal layer was peeled at this part on the occasion of further application of an external force. Meanwhile, the direction of the front line 107 of peeling was parallel to that of the shaft of the peeling roller 105. After the roll-up was continued as it was, the thin-film single-crystal GaAs was peeled as a whole from the substrate. To this back face of the GaAs, a back electrode 307 of stainless steel plate was glued using a conductive adhesive agent containing copper as a main component. On measurements using a solar simulator adjusted to AM 1.5 in this situation, a conversion efficiency of 18% was obtained. Next, when the wafer after the completion of peeling was dipped into fluoronitric acid-based etching solution, the residue of the porous layer remaining on the surface of a wafer dissolved away and the wafer surface became a mirror surface. The solar cell obtained by repetition of the above steps using this wafer also manifested a conversion efficiency of 17.5%, thereby revealing the repetitive usability of a wafer.

COMPARATIVE EXAMPLE 2

On the other hand, when a solar cell was manufactured as a trial in the same manner as with the above except that such roll-up in peeling a thin-film single-crystal layer was carried out so as to keep the shaft of a peeling roller in parallel with the orientation flat, cracking occurred in the peeled thin-film single-crystal layer and wire breaking of a grid electrode was also observed. In addition to this, the single-crystal layer remained in flakes on a wafer after the peeling, no clean face could be exposed by the etching and no substrate could be reclaimed.

EXAMPLE 8

Figure 8A:
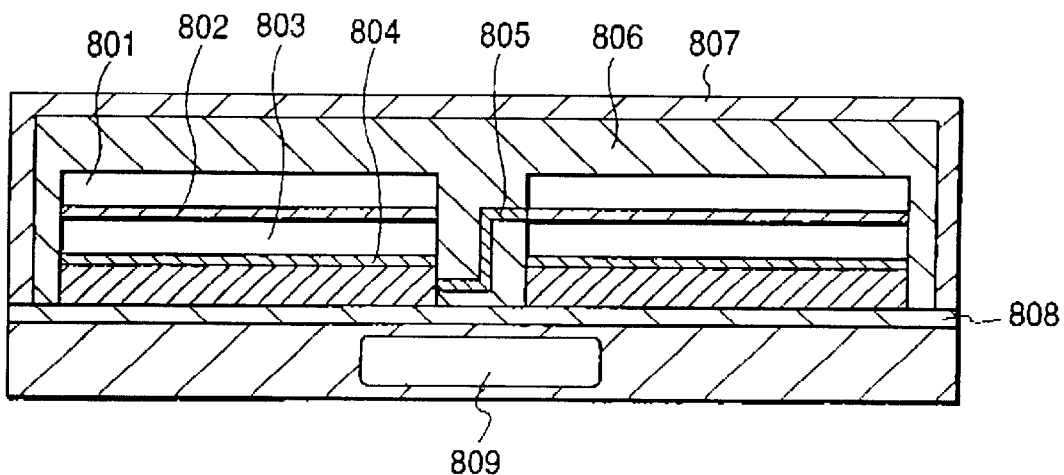
FIGS. 8A and 8B are schematic views of a solar cell module according to one example of the present invention.
Figure 8B:
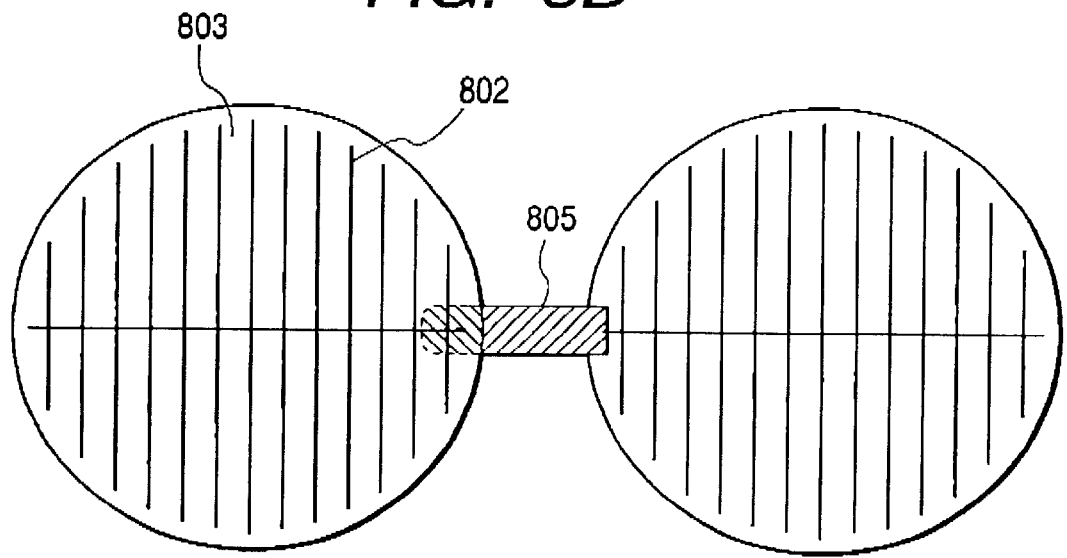

Next, by connecting solar cells manufactured under conditions similar to those of Example 4 (by peeling while carrying out a roll-up so as to orient the direction of the shaft of a peeling roller at an angle of 45 degrees to the orientation flat (orientation <100>) 106) in series as shown in FIGS. 8A and 8B, then fixing them on a backing plate (reinforcing plate) and subjecting them to a lamination processing, a solar cell module configured as shown in FIGS. 8A and 8B was fabricated. Incidentally, FIG. 8A is a schematic sectional view of a module fabricated in Example 8 and FIG. 8B is a schematic top view thereof.

In FIGS. 8A and 8B, numeral 801 denotes a sheet member, 802 a transparent electrode, 803 a solar cell con taining a thin-film single-crystal silicon layer, 804 a conductive adhesive, 805 a conductive tag for series connection, 806 a filler, 807 a front surface protective material, 808 an insulating layer, and 809 a backing plate (reinforcing plate), respectively.

Besides, as shapes of manufactured solar cell modules, a flat plate type solar cell module as shown in FIGS. 10A and 10B and a wave type solar cell module with a curvature stamped as shown in FIGS. 9A and 9B were fabricated.

At this time, two arrangements of the modules were fabricated respectively for the flat plate type module and the wave type module so as to keep the direction of bending processing (direction of arrowhead 2 in FIG. 9A: direction of plastic deformation) and the easily flexible direction (direction of arrowhead 1 in FIG. 10A) at angles of 10 degrees and 45 degrees to the orientation flat (oriented in <110>) 106 of a thin-film single-crystal layer.

Using such four types (flat plate type—10 degrees, flat type—45 degrees, wave type—10 degrees and wave type—45 degrees) of solar cell modules as estimating samples, the following estimation was made.

(Initial Appearances)

Initial appearances such as filling faults in the filler of a solar cell module (final form) and flaws on a solar cell surface were estimated. Besides, at the same time, estimate was made also from the viewpoint of a beautiful appearance of a processed solar cell module as the building material and roofing material.

Estimate was made in accordance with the following estimating criteria:

⊚ . . . Free of appearance fault and excellent also in the beautiful appearance as building and roofing materials.

○ . . . Some appearance faults but no obstacle to practical use.

x . . . So significant in poor filling and defective surface that appearance faults are very large, or significantly damaged in beautiful appearance as building and roofing materials.

(High Temperature/High Humidity Test)

After placed for 3000 hours under environments of 85° C./85% (relative humidity), a solar cell module taken out and photoelectric conversion efficiencies were measured under light irradiation of AM 1.5 and 100 W/cm² to evaluate the ratio of change from the initial value before the placement.

Estimate was made in accordance with the following estimating criteria:

⊚ . . . Below 1.0% of change in photoelectric conversion efficiency.

○ . . . 1.0 or greater and below 3.0 exclusive % of change in photoelectric conversion efficiency.

Δ . . . 3.0 or greater and below 5.0 exclusive % of change in photoelectric conversion efficiency.

x . . . 5.0% or greater of change in photoelectric conversion efficiency.

(Torsion Test)

In accordance with solar cell JIS C8917, a torsion test was made. Namely, with three angles fixed, a "torsion" of displacing one angle by 3 cm was repeated 50 times. Similar torsion was applied to all angles. After the torsion test, the outer appearance test and high temperature/high humidity test mentioned above were made and estimate was made in accordance with criteria similar to those of the above tests.

The result is shown in Table 3.

TABLE 3

| | Example 8 | | | | Comparative Example 3 | | Example 9 | |
|---|---|---|---|---|---|---|---|---|
| | Flat Plate Type | | Wave Type | | Flat Plate Type | Wave Type | Flat Plate Type | Wave Type |
| | 10° | 45° | 10° | 45° | 0° | 0° | 3° | 3° |
| Initial Appearance | ⊚ | ⊚ | ⊚ | ⊚ | ⊚ | Δ | ⊚ | ○ |
| Initial Efficiency | ⊚ | ⊚ | ⊚ | ⊚ | ⊚ | Δ | ⊚ | ○ |
| Appearance After Torsion Test | ○ | ⊚ | ○ | ⊚ | X | X | Δ | X |
| Efficiency After Torsion Test | ⊚ | ⊚ | ○ | ⊚ | X | X | Δ | Δ |

COMPARATIVE EXAMPLE 3

In the same manner as in Example 8 except that a thin-film single-crystal solar cell was arranged so as to keep the direction of bending processing (direction of arrowhead 2 in FIG. 9A) and the easily flexible direction (direction of arrowhead 1 in FIG. 10A) at angles of 0 degree (parallel) to the orientation flat (oriented in <110>) 106 of a thin-film single-crystal layer, a flat plate type module and a wave type module were fabricated and estimate was made similarly. The result is shown in Table 3 together with those of Example 8 and Comparative Example 3.

EXAMPLE 9

In the same manner as in Example 8 except that a thin-film single-crystal solar cell was arranged so as to keep the direction of being processing (direction of arrowhead 2 in FIG. 9A: direction of plastic deformation) and the easily flexible direction (direction of arrowhead 1 in FIG. 10A) at angles of 3 degrees to the orientation flat (oriented in <110>) 106 of a thin-film single-crystal layer, a flat plate type module and a wave type module were fabricated and estimate was made similarly. The result is shown in Table 3 together with those of Example 8 and Comparative Example 3.

As evident from Table 3, a solar cell module according to the present invention is found to improve in durability during the manufacturing process and during the stress application by such an arrangement as to deviate the direction of easily cleaving in a thin-film solar cell from the easily flexible direction peculiar to the solar cell module.

EXAMPLE 10

Similarly to Example 8, Comparative Example 3 and Example 9, solar cell modules were fabricated with a wide variety of angle between the easy cleavage direction of a thin-film single-crystal layer solar cell and the easily flexible direction peculiar to solar cell modules or the plastic deformation angle, and estimate was made similarly to Example 8. As a result, it was confirmed that an excellent effect was obtained when the angle was equal to and greater than 5 degrees and a especially significant effect was obtained when the angle was equal to and greater than 10 degrees.

As mentioned above, according to the method of the present invention, a thin-film single-crystal can be repetitively peeled from the substrate as the thin-film single-crystal has high quality, while damages or deteriorations during processing can be also suppressed in case of module formation of thin-film single-crystal solar cells, and a highly durable solar cell module during use can be also manufactured at low cost and good yield.

What is claimed is:

1. A method of producing a thin-film single-crystal device by utilizing a thin-film single-crystal, which comprises the steps of:
    forming a peeling layer and a thin-film single-crystal on a surface of a substrate in this order;
    bonding a flexible sheet member to a surface of the thin-film single-crystal or to a surface of a layer additionally formed on the surface of the thin-film single-crystal; and
    peeling the thin-film single-crystal together with the sheet member from the substrate by applying force to the sheet member so as to curve the sheet member,
    wherein in the peeling step, the peeling of the thin-film single-crystal is carried out in such a manner that directions of all straight lines made on a surface of the thin film by appearance of planes in which the thin-film single-crystal is most apt to cleave are different from a direction of a front line of a peeled portion.

2. The method of producing a thin-film single-crystal device according to claim 1, wherein an angle between the front line of the peeled portion and said straight lines is 5 degrees or larger.

3. The method of producing a thin-film single-crystal device according to claim 1, wherein an angle between the front line of the peeled portion and the straight lines is 10 degrees or larger.

4. The method of producing a thin-film single-crystal device according to claim 1, wherein the thin-film single-crystal has a diamond structure.

5. The method of producing a thin-film single-crystal device according to claim 1, wherein the thin-film single-crystal has a zinc blende structure.

6. The method of producing a thin-film single-crystal device according to claim 1, wherein the substrate is a single-crystal wafer, the peeling layer is a porous layer formed on the surface of the single-crystal wafer, and the thin-film single-crystal is a thin film epitaxially grown on the surface of the porous layer.

7. The method of producing a thin-film single-crystal device according to claim 1, wherein the thin-film single-crystal device is a solar cell.

8. The method of producing a thin-film single-crystal device according to claim 1, wherein the thin-film single-crystal device is an image display element-driving circuit member.

9. A solar cell module with flexibility comprising a photovoltaic element having a thin-film single-crystal as at least one portion thereof, wherein a direction in which the module is inherently apt to flex is different from a direction in which the thin-film single-crystal is most apt to cleave.

10. A solar cell module with flexibility comprising a photovoltaic element having a thin-film single-crystal as at least one portion thereof, wherein at least one portion of a region of the module having the thin-film single-crystal is subjected to plastic deformation, and a direction of the plastic deformation is different from a direction in which the thin-film single-crystal is most apt to cleave.

11. The solar cell module according to claim 9 or 10, wherein the thin-film single-crystal has a diamond structure.

12. The solar cell module according to claim 9 or 10, wherein the thin-film single-crystal has a zinc blende structure.

13. The solar cell module according to claim 9 or 10, wherein the thin-film single-crystal is produced by forming a peeling layer and a thin-film single-crystal on a surface of a substrate in this order, bonding a flexible plate-shaped member to a surface of the thin-film single-crystal or to a surface of a layer additionally formed on the surface of the thin-film single-crystal, and peeling the thin-film single-crystal together with the plate-shaped member from the substrate by applying force to the plate-shaped member so as to curve the plate-shaped member.

14. The solar cell module according to claim 9 or 10, wherein the thin-film single-crystal is a thin-film single-crystal produced by a method comprising at least a polishing step.

15. The solar cell module according to claim 9 or 10, wherein the thin-film single-crystal is a thin-film single-crystal produced by a method comprising at least an etching step.

16. The solar cell module according to claim 9, wherein an angle between the direction in which the module is inherently apt to flex and the direction in which the thin-film single-crystal is most apt to cleave is 5 degrees or larger.

17. The solar cell module according to claim 9, wherein an angle between the direction in which the module is inherently apt to flex and the direction in which the thin-film single-crystal is most apt to cleave is 10 degrees or larger.

18. The solar cell module according to claim 10, wherein an angle between the direction of the plastic deformation and the direction in which the thin-film single-crystal is most apt to cleave is 5 degrees or larger.

19. The solar cell module according to claim 10, wherein an angle between the direction of the plastic deformation and the direction in which the thin-film single-crystal is most apt to cleave is 10 degrees or larger.

20. A method of producing a solar cell module with flexibility comprising a photovoltaic element having a thin-film single-crystal as at least one portion thereof, which comprises arranging the thin-film single-crystal in such a manner that a direction in which the module is inherently apt to flex is different from a direction in which the thin-film single-crystal is most apt to cleave.

21. A method of producing a solar cell module with flexibility comprising a photovoltaic element having a thin-film single-crystal as at least one portion thereof, which comprises a step of subjecting at least one portion of a region having the thin-film single-crystal of the module to plastic deformation, wherein the plastic deformation is carried out in such a manner that a direction of the plastic deformation is different from a direction in which the thin-film single-crystal is most apt to cleave.

22. The method of producing a solar cell module according to claim 20 or 21, wherein the thin-film single-crystal has a diamond structure.

23. The method of producing a solar cell module according to claim 20 or 21, wherein the thin-film single-crystal has a zinc blende structure.

24. The method of producing a solar cell module according to claim 20 or 21, further comprising a step of producing the thin-film single-crystal by forming a peeling layer and a thin-film single-crystal layer on a surface of a substrate in this order, bonding a flexible plate-shaped member to the surface of the thin-film single-crystal or to a surface of a layer additionally formed on the surface of the thin-film single-crystal, and peeling the thin-film single-crystal together with the plate-shaped member from the substrate by applying force to the plate-shaped member so as to curve the plate-shaped member.

25. The method of producing a solar cell module according to claim 20 or 21, further comprising a step of producing the thin-film single-crystal by a method comprising at least a polishing step.

26. The method of producing a solar cell module according to claim 20 or 21, further comprising a step of producing the thin-film single-crystal by a method comprising at least an etching step.

27. The method of producing a solar cell module according to claim 20, wherein an angle between the direction in which the module is inherently apt to flex and the direction in which the thin-film single-crystal is most apt to cleave is 5 degrees or larger.

28. The method of producing a solar cell module according to claim 20, wherein an angle between the direction in which the module is inherently apt to flex and the direction in which the thin-film single-crystal is most apt to cleave is 10 degrees or larger.

29. The method of producing a solar cell module according to claim 21, wherein an angle between the direction of the plastic deformation and the direction in which the thin-film single-crystal is most apt to cleave is 5 degrees or larger.

30. The method of producing a solar cell module according to claim 21, wherein an angle between the direction of the plastic deformation and the direction in which the thin-film single-crystal is most apt to cleave is 10 degrees or larger.

* * * * *

UNITED STATES PATENT AND TRADEMARK OFFICE
CERTIFICATE OF CORRECTION

PATENT NO. : 6,452,091 B1
DATED : September 17, 2002
INVENTOR(S) : Katsumi Nakagawa et al.

It is certified that error appears in the above-identified patent and that said Letters Patent is hereby corrected as shown below:

Column 3,
Line 48, "remain" should read -- keep --.

Column 6,
Line 47, "taking" should read -- by taking --.

Column 8,
Line 10, "fracture" should read -- fractured --.

Column 9,
Line 19, "they" should read -- the --;
Line 59, "period" should read -- period of --.

Column 10,
Line 4, "period" should read -- period of --;
Line 50, "numerals" should read -- numeral --.

Column 11,
Line 9, "numerals" should read -- numeral --.

Column 13,
Line 58, "servableby" should read -- servable by --.

Column 14,
Line 24, "$\mu$from" should read -- $\mu$m from --.

Column 15,
Line 3, "minutes" should read -- minute --.

Column 17,
Line 12, "n" should read -- in --.

Column 18,
Line 66, "con" should read -- con- --.

UNITED STATES PATENT AND TRADEMARK OFFICE
CERTIFICATE OF CORRECTION

PATENT NO. : 6,452,091 B1
DATED : September 17, 2002
INVENTOR(S) : Katsumi Nakagawa et al.

It is certified that error appears in the above-identified patent and that said Letters Patent is hereby corrected as shown below:

Column 19,
Line 42, "After" should read -- After being --;
Line 43, "taken" should read -- was taken --.

Column 20,
Line 38, "being" should read -- bending --;
Line 57, "angle" should read -- angles --;
Line 63, "a" should read -- an --.

Signed and Sealed this

Eleventh Day of March, 2003

JAMES E. ROGAN
*Director of the United States Patent and Trademark Office*